United States Patent [19]
Hasenberg et al.

[11] Patent Number: 5,420,442
[45] Date of Patent: May 30, 1995

[54] N-TYPE ANTIMONY-BASED STRAINED LAYER SUPERLATTICE

[75] Inventors: Thomas C. Hasenberg, Agoura Hills; April S. Brown, Westlake Village; Lawrence E. Larson, Santa Monica, all of Calif.

[73] Assignee: Hughes Aircraft Company, Los Angeles, Calif.

[21] Appl. No.: 223,373

[22] Filed: Apr. 5, 1994

Related U.S. Application Data

[63] Continuation of Ser. No. 866,372, Apr. 9, 1992, abandoned.

[51] Int. Cl.$^6$ .................... H01L 29/80; H01L 29/207
[52] U.S. Cl. ........................... 257/22; 257/20; 257/192
[58] Field of Search .............. 257/18, 20, 22, 28, 257/192, 190, 201

[56] References Cited

U.S. PATENT DOCUMENTS

| | | | |
|---|---|---|---|
| 4,517,047 | 5/1985 | Chang et al. | 156/610 |
| 4,607,272 | 8/1986 | Osbourn | 257/18 |
| 4,780,748 | 10/1988 | Cunningham et al. | 257/28 |
| 4,797,716 | 1/1989 | Chaffin et al. | 257/20 |

FOREIGN PATENT DOCUMENTS 0133342  6/1984  European Pat. Off. .

OTHER PUBLICATIONS

Patent Abstracts of Japan, "Two-Dimensional Electron Gas Field-Effect Transistor," F. Akio, JP900090602, May 4, 1990, NEC Corp.
Patent Abstracts of Japan, "High Electron Mobility Transistor," H. Yasumi, JP900053924, Jun. 3, 1990, Fujitsu Ltd.
Sunder et al., "Czochralski Growth and Characterization of GaSb", *Journal of Crystal Growth*, vol. 78, No. 9, 1986, pp. 9–18.
Dingle et al., "Electron mobilities in modulation-doped semiconductor hetero-junction superlattice", *Applied Physics Letters*, vol. 33, No. 7, Oct. 1, 1978, pp. 665–667.
Tuttle et al., "Effects of interface layer sequencing on the transport properties of InAs/AlSb: Evidence for antisite donors at the InAs/AlSb interface", *Journal of Applied Physics*, vol. 67, No. 6, Mar. 15, 1990, pp. 3032–3037.
Wang ed, *Introduction to Semiconductor Technology-GaAs and Related Compounds*, Chap. 2 by Shor, Chap. 3 by Pei et al., John Wiley & Sons, 1990, pp. 67–71 and 148–152.

Primary Examiner—Robert P. Limanek
Assistant Examiner—David B. Hardy
Attorney, Agent, or Firm—V. D. Duraiswamy; W. K. Denson-Low

[57] ABSTRACT

High speed Group III-Sb materials are n-doped in a molecular beam epitaxy process by forming a superlattice with n-doped strained layers of a Group III-V compound upon Group III-Sb base layers. The base layers have lower conduction band energy levels than the strained layers, and allow doping electrons from the strained layers to flow into the base layers. The base layers preferably comprise $Al_xGa_{1-x}Sb$, while the strained layers preferably comprise a binary or ternary compound such as $Al_yGa_{1-y}As$ having a single Group V component, where x and y are each from 0 to 1.0. The strained layers can be n-doped with silicon or tin, which would produce p-type doping if added directly to the base layers.

16 Claims, 2 Drawing Sheets

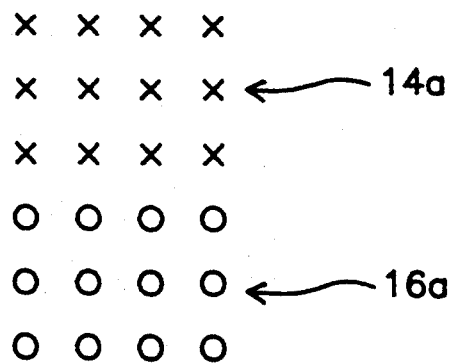
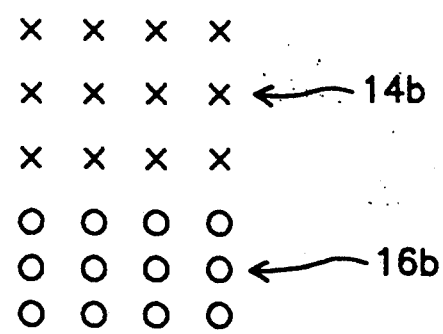
Fig.3a  Fig.3b
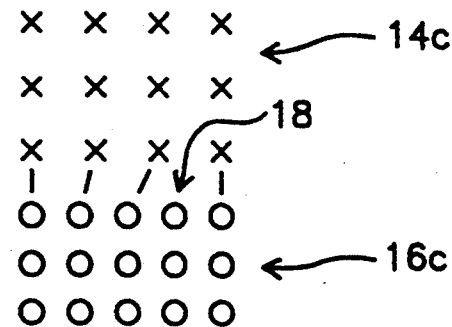
Fig.3c
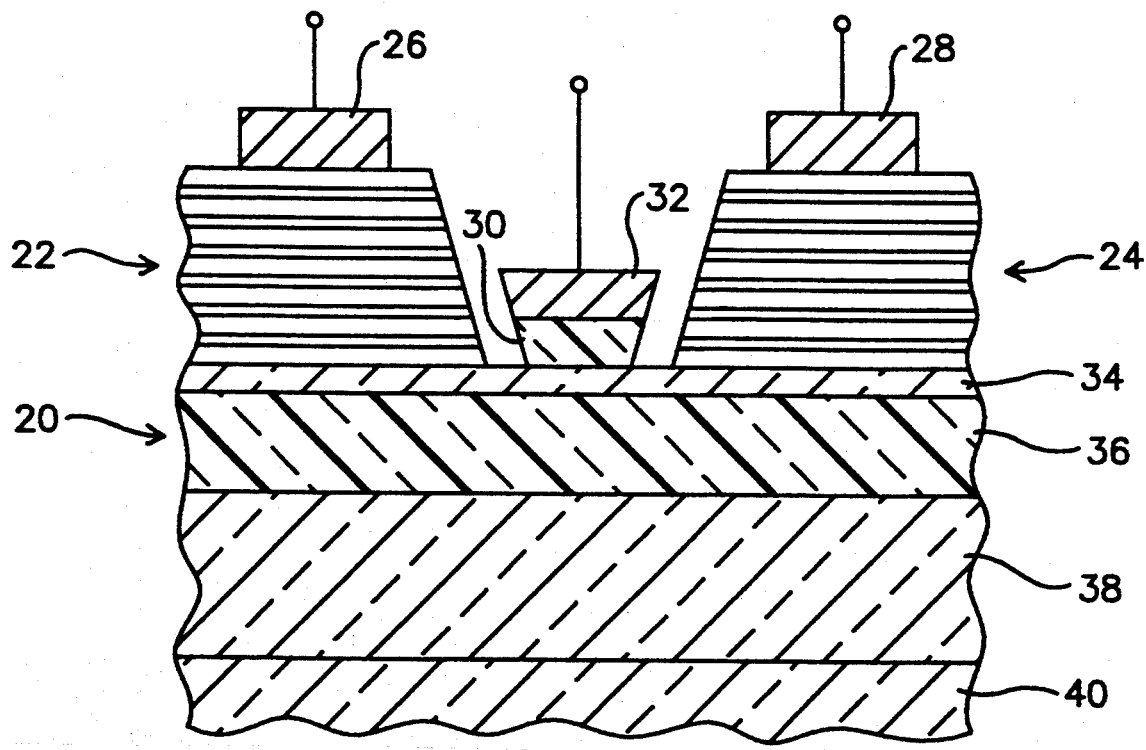
Fig.4

N-TYPE ANTIMONY-BASED STRAINED LAYER SUPERLATTICE

This is a continuation of application Ser. No. 07/866,372, filed Apr. 9, 1992, now abandoned.

BACKGROUND OF THE INVENTION

1. Field of the Invention

This invention relates to superlattice semiconductor devices, and more particularly to antimony-based superlattices that are doped n-type with silicon or tin, and to related fabrication methods.

2. Description of the Related Art

Antimony (Sb)-based compounds have shown considerable potential for far-infrared detector applications and as heterojunction materials that can be used with InAs channel high electron mobility transistors (HEMTs). Certain antimony-based compounds have a small bandgap energy and a corresponding high electron mobility, making them useful for high speed devices. Group III-Sb compounds, particularly GaSb and AlGaSb are of particular interest.

Silicon is the most commonly used n-type dopant for Group III-V molecular beam epitaxy (MBE) growth processes; tin is another suitable n-type dopant. Silicon's low vapor pressure makes it easily controllable in the normal flux source temperature range used in standard MBE processing. However, silicon is not amphoteric in antimony compounds, but acts as a p-type dopant, and cannot be used to produce n-type material. On the other hand, Group VI impurities such as S, Te and Se are well-behaved n-type impurities for GaSb and other III-Sb compounds. "Captive source" configurations are currently used in which the Group VI impurity is evaporated from a lower vapor pressure compound, such as Te from a PbTe source. The use of Group VI n-type dopants is discussed in Sunder et al., "Czochralski Growth and Characterization of GaSb", *Journal of Crystal Growth*, Vol. 78, No. 9, 1986, pages 9–18. Unfortunately, Group VI materials have very high vapor pressures, and accordingly have a strong tendency to leave residual amounts of the Group VI material in the MBE apparatus. This residue contaminates the MBE machine and interferes with later p-type processing with the same machine.

In the silicon or Group VI doping mentioned above, the dopant impurity is introduced directly into the material to be doped by opening shutters for both the dopant and for the material being doped during the MBE growth process. A modified doping technique that has been used for HEMTs is referred to as modulation doping, and is described in Dingle et al., "Electron mobilities in modulation-doped semiconductor heterojunction superlattice", *Applied Physics Letters*, Vol. 33, No. 7, 1 Oct. 1978, pages 665–667. The typical application of modulation doping is in the n-type doping of GaAs. It would be desirable to dope the GaAs with silicon, but silicon doping produces impurity scattering in the GaAs. Instead of directly doping it with silicon, alternating layers of GaAs and a generally lattice matched material, typically AlGaAs, are grown. The AlGaAs layers, but not the GaAs layers, are doped with silicon. This produces a concentration of mobile electrons in the AlGaAs that, because of the higher electron affinities of the adjacent GaAs layers, drift into those layers. The drift of electrons into the GaAs layers avoids the impurity scattering associated with a direct doping of the GaAs with silicon, and thereby increases the device's mobility and speed. However, this type of doping is not directly applicable to Group III-Sb compounds, since such compounds are not closely lattice matched with either GaAs or AlGaAs.

Modulation doping of InAs by impurity-doped AlGaSb layers has also been reported in Tuttle et al., "Effects of interface layer sequencing on the transport properties of InAs/AlSb: Evidence for antisite donors at the InAs/AlSb interface", *Journal of Applied Physics*, Vol. 67, No. 6, 15 Mar. 1990, pages 3032–3037. Thus far, however, the reported doping and high mobilities have not been found to be reproducible. Furthermore, electron mobility dropped more than usual as the dopant concentration increased, apparently because of defects near the interface, thus limiting the potential operating speed.

One type of HEMT that combines lattice-mismatched materials is discussed in Wang ed, *Introduction to Semiconductor Technology-GaAs and Related Compounds*, Chap. 2 by Shor, Chap. 3 by Pei et al., John Wiley & Sons, 1990, pages 67–71, and 148–152. It involves an AlGaAs/InGaAs/GaAs structure with an InGaAs channel layer that is kept fairly thin, on the order of 150 Angstroms. The advantage of such structures is the higher electron velocity and mobility of InGaAs. The rather large lattice mismatches are accommodated by elastic deformations in the thin heterostructure layers, with a lattice-mismatched InGaAs channel grown on either GaAs or InP substrates; AlSb/InAs quantum well HFETs have also been realized. The relatively thin channel layer that has been elastically deformed is referred to as a strained layer. However, this type of strained layer device does not solve the problem of n-type doping for antimony based compounds used for the source and drain layers.

SUMMARY OF THE INVENTION

The present invention seeks to provide an n-type doping of Group III-Sb compounds without the MBE contaminating effects of Group VI dopants. To accomplish this, an n-doped strained layer of a Group III-V compound is formed upon a Group III-Sb base layer such as $Al_xGa_{1-x}Sb$, with the III-V compound having a lower electron affinity and higher conduction band energy level than the base layer. The III-V compound comprises a binary or ternary compound having a single Group V component, such as $Al_yGa_{1-y}As$. The strained layer is preferably doped with either silicon or tin by MBE. A superlattice of alternating base and strained layers is built up, with mobile electrons from the doped strained layers drifting into the lower bandgap base layers. The thickness of the strained layers is restricted so that they do not exceed the critical thickness for coherently strained layers with the particular materials used, while the base layers are preferably about 25–100 Angstroms thick for $Al_xGa_{1-x}Sb$.

When applied to a HEMT, the Sb-based doped superlattice is employed for the electron supply layer of the device. For high speed operation, the channel may be formed from $In_zGa_{1-z}As$.

Further features and advantages of the invention will be apparent to those skilled in the art from the following detailed description, taken together with the accompanying drawings, which are not to scale.

BRIEF DESCRIPTION OF THE DRAWINGS

FIGS. 3a, 3b and 3c are two-dimensional lattice diagrams of a lattice matched junction, a strained layer junction without dislocations, and a strained layer junction with dislocations between two different materials, respectively; and FIG. 4 is a sectional view of an FET constructed in accordance with the invention.

DETAILED DESCRIPTION OF THE INVENTION

Figure 1:
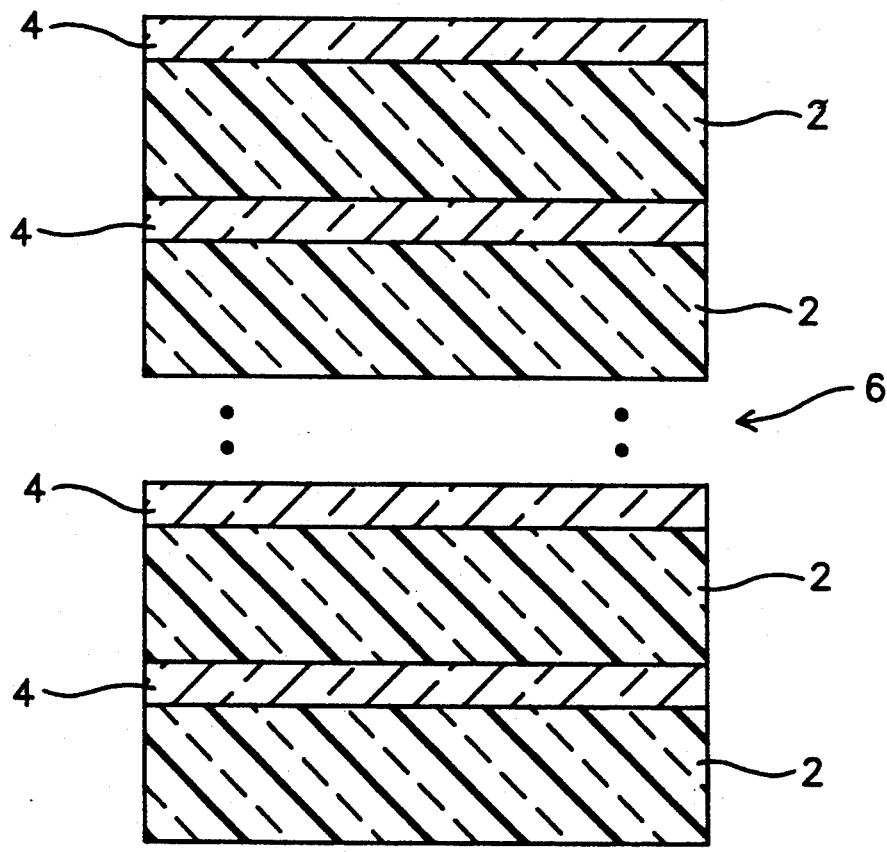
FIG. 1 is a sectional view of a strained layer superlattice in accordance with the invention.

FIG. 1 illustrates a superlattice structure consisting primarily of an n-doped Group III-Sb material, in which the doping is achieved in accordance with the invention without the use of a Group VI dopant material and its accompanying contamination of the MBE apparatus. The structure consists of a series of Group III-Sb base layers 2 that alternate with doping layers 4 formed from a Group III-V compound that has been doped with a suitable n-type dopant, such as silicon or tin. The layers are preferably grown with a conventional MBE system, with the growth period for the doping layers 4 considerably shorter than for the base layers 2 so that the doping layers are substantially thinner than the base layers. The doping layers 4 are kept thin enough so that, even though their lattices are not closely matched with the lattice structure of the base layers 2, they are established as strained layers that assume the lattice dimensions of the base layers 2 at the junction between the two materials. As described below, mobile electrons from the doping layers 4 drift into the original undoped base layers 2, producing a doping throughout the entire superlattice structure. The superlattice characteristics are predominantly III-Sb, since that is the majority material.

In general, the base layers 2 can consist of any Group III-Sb compound, with $Al_xGa_{1-x}Sb$ being the preferred formulation for present applications, where x can vary from 0 to 1.0. Other compounds such as InGaSb and InAlSb can also be used for the base layers, with varying proportions of In/Ga and In/Al.

The doping layers 4 have the desired property of accepting a silicon or tin impurity as an n-type dopant, in contrast to the p-type doping action of these impurities in the Sb-compound base layers 2. When used in GaAs-based devices, the doping layers 4 are preferably of the form $Al_yGa_{1-y}As$, where y can vary from 0 to 1.0. The thicknesses of the doping layers 4 is restricted so they do not exceed the critical thickness above which dislocations are formed at the junctions between the base and doping layers. The critical thickness varies with differential materials, but is generally on the order of 2-5 monolayers, with each monolayer typically about 3 Angstroms thick. The critical thickness for GaAs on GaSb is about 2-3 monolayers, as compared with a critical thickness of about 5 monolayers for InP on GaSb. In general, it is desirable to grow thicker doping layers so they can accommodate a greater total amount of doping impurities. However, MBE with InP requires a gas source rather than the solid source used for GaAs, and thus requires more complicated and expensive MBE equipment to implement.

It may be possible to use virtually any Group III-V combination for the doping layers. However, it is presently uncertain whether compounds with two Group V components, such as GaAsSb or GaPSb, would be doped n-type or p-type by silicon (Sb, As and P are in Group V, while Ga, Al and In are in Group III). Binary or ternary Group III-V doping layers with only a single Group V component are accordingly preferred.

The overall superlattice 6 is typically several hundred Angstroms thick, with the base layers each about 25–100 Angstroms thick for GaSb; 5–10 base/doping layer periods are typical.

Figure 2:
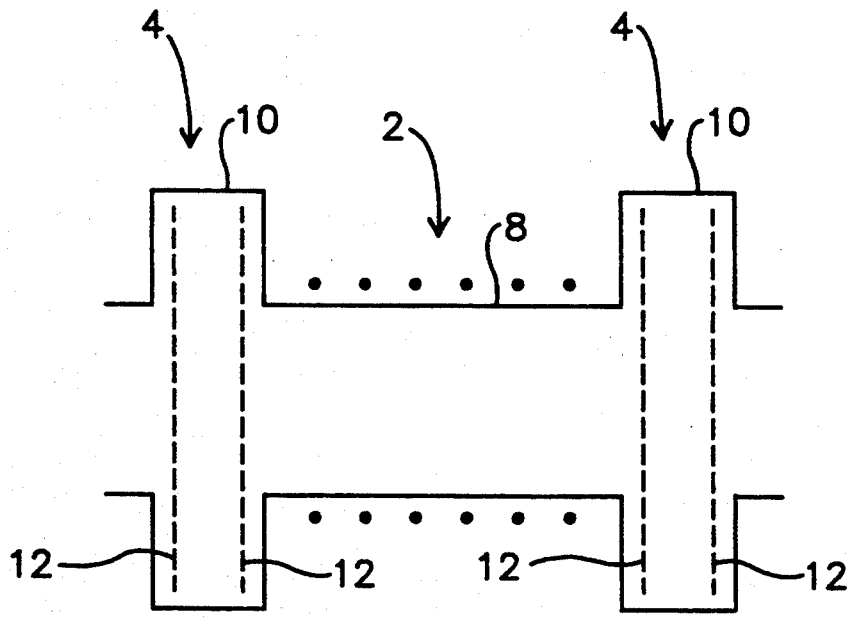
FIG. 2 is a bandgap energy diagram of a portion of the superlattice in FIG. 1.

FIG. 2 is an energy diagram that illustrates the process by which the entire superlattice is doped n-type when the silicon or tin is originally added to only the doping layers 4. The base layers 2 are selected to have a lower conduction band energy level, indicated by trace 8, than the conduction band energy level of the doping layers 4, indicated by trace 10. The lower conduction band energy base layers have a greater electron affinity, allowing mobile electrons from the doping layers to drift into the base layers and dope them n-type without the addition of any dopant impurities into the base layers. The portions 12 of the doping layers immediately adjacent the base layers are preferably left undoped to avoid the risk of the dopant material spilling over into the base layers; the undoped sections of the doping layers are indicated as being bounded by dashed lines in FIG. 2.

The invention thus makes it possible to produce n-type doping in a Group III-Sb material such as GaSb with a silicon dopant, despite the fact that no non-antimony containing semiconductor materials are presently known that have both a larger conduction band energy than GaSb and a close lattice match with GaSb.

The various degrees of lattice matching are illustrated in FIGS. 3a–3c. FIG. 3a illustrates two materials 14a and 16a, whose atoms are indicated respectively by x's and o's, that are closely latticed matched. Their lattice sites match up with each other, and one material can be grown upon the other material by MBE with indefinite thicknesses for both materials.

In FIG. 3b the two materials 14b and 16b are not closely lattice matched; material 16b normally has a smaller lattice dimension than material 14b. However, if the growth of material 16b does not exceed its critical thickness, the lattice structure of material 16b will stretch in the x, y plane parallel to the junction between the two materials, so that the lattices of the two materials align along this junction. This is accompanied by a contraction of the lattice structure for material 16b in the z direction perpendicular to the junction between the two materials.

The third situation is illustrated in FIG. 3c. Here material 16c again has a smaller lattice structure than material 14c. However, material 16c is grown to a thickness greater than its critical thickness. This results in the formation of dislocations, consisting of extra columns 18 of material 16c atoms in the z direction, and degrades the electron mobility in the 16c material. A strained layer that exhibits such dislocations is referred to as an incoherently strained layer, as opposed to the coherently strained layer of FIG. 3b. With the present invention the thicknesses of the doping layers 4 are preferably restricted as described above so that these layers are coherently strained.

Other than the Group VI dopants that the invention seeks to avoid, silicon and tin are the only presently known n-type dopants that work well with MBE. The dopant can be combined with the Group III-V material of the doping layers 4 either by opening a silicon or a tin shutter in the MBE apparatus as the doping layers are being grown (except for the undoped portions 12), or by a conventional delta doping technique in which a thin silicon layer is grown in the middle of the doping layer. The dopant concentration in the doping layers 6 will typically be within the range of about $1 \times 10^{16}$–$1 \times 10^{20}$ cm$^{-3}$, which produces a doping concentration in the overall superlattice in the range of about $1 \times 10^{15}$–$1 \times 10^{19}$ cm$^{-3}$.

Taking the invention one step further, the superlattice itself can form the dopant source for another Group III-Sb compound with which it is fairly closely lattice matched. For example, if the superlattice base layers 2 are of the form $Al_xGa_{1-x}Sb$, the superlattice can be grown adjacent another layer of $Al_zGa_{1-z}Sb$, where z is less than x. Since the reduction in the aluminum content of the second material from x to z also reduces its bandgap energy level, mobile electrons in the superlattice will drift into the adjacent $Al_zGa_{1-z}Sb$ material and dope it as well.

An FET 20 that makes use of the invention is illustrated in FIG. 4. The device's source 22 and drain 24 are formed from a doped superlattice as described above, with respective metallized source and drain contacts 26 and 28. The central portion of the superlattice between the source and drain is removed, or the two superlattices can be grown separately in the first place with the use of appropriate masks. An undoped semiconductor or $SiO_2$ insulating oxide layer 30 capped by a gate contact 32 is then formed over the channel between the two superlattices. In the exemplary device illustrated in FIG. 4, the superlattice consists of AlGaSb base layers and silicon-doped AlGaAs doping layers, with a total thickness of about 100–300 Angstroms.

A thin spacer layer 34 is formed between the underside of the superlattice and a channel layer 36. The spacer layer, which may be AlGaSb, isolates the superlattice dopant from the underlying channel but is thin enough (on the order of 30 Angstroms) so as to not significantly interrupt electron flow between the source and drain and the channel. The channel 36 is itself undoped, and may consist of a high mobility material such as $In_zGa_{1-z}As$ about 120 Angstroms thick, where z is from 0 to 1.0.

The channel 36 is formed on a buffer layer 38, which is preferably GaSb for AlGaSb base layers in the superlattice, and on the order of 4,000 Angstroms thick. The buffer layer in turn is formed on a semi-insulating GaSb substrate 40 that is normally considerably thicker. A two-dimensional electron gas (2 Deg) is formed along the surface of the channel between the source and drain superlattices in the conventional manner.

Several sample superlattices with undoped GaSb base layers and silicon-doped GaAs doping layers have been formed. The doping layers were grown at a rate of 1Å–3Å/sec, with a silicon dopant temperature of 1150°–1320° C.; 5–250 base-doping periods were formed. In three of the samples the GaSb layers were 90 Angstroms thick, while in the fourth they were 72 Angstroms thick. The GaAs doping layers were four monolayers thick in the first sample, and two monolayers thick in the second through fourth samples. Electron concentrations over the entire superlattice of 3.3, 2.7 and $2.1 \times 10^{16}$ cm$^{-3}$ for the first, second and third samples, respectively, resulted in respective electron mobilities of 2,938, 2,698 and 2,421 cm$^2$/v-s. In the fourth sample the electron concentration was $2.9 \times 10^{16}$ cm$^{-3}$, and the electron mobility was 2,704 cm$^2$/v-s. The calculated silicon doping densities within the GaAs doping layers were $3.2 \times 10^{17}$, $4.9 \times 10^{17}$, $3.8 \times 10^{17}$, and $4.3 \times 10^{17}$ cm$^{-3}$ for the first through fourth samples, respectively.

The observed electron mobility compared favorably with a calculated electron mobility in lightly doped n-type GaSb of about 4,000 cm$^2$/v-s, and further improvements can be expected. The invention thus makes it possible to realize heterostructures and superlattices of n-doped, MBE grown Sb compounds without the contamination of the MBE system that results from the conventional use of Group VI dopants. While several illustrative embodiments of the invention have been described, numerous variations and alternate embodiments will occur to those skilled in the art. Such variations and alternate embodiments are contemplated, and can be made without departing from the spirit and scope of the invention as defined in the appended claims.

We claim:

1. An n-doped semiconductor superlattice, comprising:
   a plurality of base layers of predetermined thicknesses and lattice dimensions of a Group III-Sb compound having mobile electrons therein sufficient for electrical current conduction, said base layers being substantially free of n-dopant impurities, and
   a plurality of n-doped strained layers of a Group III-V compound that does not include Sb, said strained layers being sandwiched between and forming respective junctions with successive base layers, said strained layers having predetermined thicknesses of at least one monolayer each, the thicknesses of said strained layers being less than the thicknesses of said base layers so that said strained layers assume the lattice dimensions of said base layers at the junctions between said base layers and strained layers, said strained layers having a higher bandgap energy and including an n-dopant impurity that would dope said base layers p-type if applied to said base layers and that comprises a material other than a Group III-V compound,
   said base and strained layers being sufficiently thin to enable a charge flow across said junctions.

2. An n-doped semiconductor super-lattice, comprising:
   a plurality of base layers of predetermined thicknesses and lattice dimensions of a Group III-Sb compounds comprising $Al_xGa_{1-x}Sb$, where x is from 0 to 1.0, and having mobile electrons therein sufficient for electrical current conduction, and
   a plurality of n-doped strained layers of a Group III-V compound sandwiched between and forming respective junctions with successive base layers, said strained layers having predetermined thicknesses of at least one monolayer each, the thicknesses of said strained layers being less than the thicknesses of said base layers so that said strained layers assume the lattice dimensions of said base layers at the junctions between said base layers and strained layers, said strained layers having a higher bandgap energy and including an n-dopant impurity that comprises a material other than a Group III-V compound, said base and strained layers being sufficiently thin to enable a charge flow across said junctions.

3. The superlattice of claim 1, said III-V compound comprising a binary or ternary compound having a single Group V component.

4. An n-doped semiconductor super-lattice, comprising:
a plurality of base layers of predetermined thicknesses and lattice dimensions of a Group III-Sb compound having mobile electrons therein sufficient for electrical current conduction, and
a plurality of $Al_yGa_{1-y}As$ n-doped strained layers sandwiched between and forming respective junctions with successive base layers, where y is from 0 to 1.0, said strained layers having predetermined thicknesses of at least one monolayer each, the thicknesses of said strained layers being less than the thicknesses of said base layers so that said strained layers assume the lattice dimensions of said base layers at the junctions between said base layers and strained layers, said strained layers having a higher bandgap energy and including an n-dopant impurity that comprises a material other than a Group III-V compounds,
said base and strained layers being sufficiently thin to enable a charge flow across said junctions.

5. An n-doped semiconductor super-lattice, comprising:
a plurality of base layers of predetermined thicknesses and lattice dimensions of a Group III-Sb compound having mobile electrons therein sufficient for electrical current conduction, and
a plurality of n-doped strained layers of a Group III-V compound sandwiched between the forming respective junctions with successive base layers, said strained layers having predetermined thicknesses of at least one monolayer each, the thicknesses of said strained layers being less than the thicknesses of said base layers so that said strained layers assume the lattice dimensions of said base layers at the junctions between said base layers and strained layers, said strained layers having a higher bandgap energy and including a silicon or tin n-dopant impurity,
said base and strained layers being sufficiently thin to enable a charge flow across said junctions.

6. The superlattice of claim 1, wherein the thicknesses of said strained layers are not greater than a critical thickness for a coherently strained layer of said compound upon said base layer material.

7. An n-doped semiconductor superlattice, comprising:
a plurality of $Al_xGa_{1-x}Sb$ base layers with thicknesses in the approximate range of 25-100 Angstroms, where x is from 0 to 1.0, and predetermined lattice dimensions, said base layers having mobile electrons therein sufficient for electrical current conduction, and
a plurality of n-doped strained layers of a Group III-V compound sandwiched between and forming respective junctions with successive base layers, said strained layers having predetermined thicknesses of at least one monolayer each, the thicknesses of said strained layers being less than the thicknesses of said base layers so that said strained layers assume the lattice dimensions of said base layers at the junctions between said base layers and strained layers, said strained layers having a higher bandgap energy and including an n-dopant impurity that comprises a material other than a Group III-V compound,
said base and strained layers being sufficiently thin to enable a charge flow across said junctions.

8. A field-effect transistor (FET), comprising:
a) a semiconductor channel layer having a predetermined conduction band energy level,
b) n-doped source and drain semiconductor superlattices on said channel layer, each superlattice comprising:
i) a plurality of base layers of predetermined thicknesses and lattice dimensions of a Group III-Sb compound having mobile electrons therein sufficient for electrical current conduction and a higher conduction band energy level than said channel layer,
ii) a plurality of n-doped strained layers of a Group III-V compound sandwiched between and forming respective junctions with successive base layers, said strained layers having predetermined thicknesses of at least one monolayer each, the thicknesses of said strained layers being less than the thicknesses of said base layers so that said strained layers assume the lattice dimensions of said base layers at the junctions between said base layers and strained layers, said strained layers having a higher conduction band energy level, and including an n-dopant impurity that comprises a material other than a Group III-V compound,
said base and strained layers being sufficiently thin to enable a charge flow across said junctions,
c) an insulating layer on said channel layer between said source and drain superlattices, and
d) respective gate, source and drain contacts on said insulating layer and said source and drain superlattices.

9. The FET of claim 8, wherein said base layers comprise $Al_xGa_{1-x}Sb$, where x is from 0 to 1.0.

10. The FET of claim 8, said III-V compound comprising a binary or ternary compound having a single Group V component.

11. The FET of claim 10, said III-V compound comprising $Al_yGa_{1-y}As$, where y is from 0 to 1.0.

12. The FET of claim 8, further comprising an undoped spacer layer between said source and drain superlattices and said channel layer, said a spacer layer isolating said channel layer from the dopant in said strained layers but being thin enough so that it does not substantially interrupt charge flow between said source and drain superlattices and said channel layer.

13. The FET of claim 8, wherein said strained layer dopant impurity is silicon or tin.

14. The FET of claim 8, wherein the thicknesses of said strained layers are not greater than a critical thickness for a coherently strained layer of said compound upon said base layer material.

15. The FET of claim 8, wherein said base layers comprise $Al_xGa_{1-x}Sb$ and said predetermined base layer thicknesses are in the approximate range of 25-100 Angstroms, where x is from 0 to 1.0.

16. The FET of claim 8, wherein said channel layer comprises $In_zGa_{1-z}As$, where z is from 0 to 1.0.

* * * * *